(12) United States Patent
Mitsui et al.

(10) Patent No.: US 9,690,879 B2
(45) Date of Patent: Jun. 27, 2017

(54) SUBSTRATE PROCESSING APPARATUS, METHOD OF MANUFACTURING SEMICONDUCTOR DEVICE, AND METHOD OF GENERATING RECIPE

(71) Applicant: Hitachi Kokusai Electric Inc., Tokyo (JP)

(72) Inventors: Hiroyuki Mitsui, Toyama (JP); Susumu Nishiura, Toyama (JP); Hiroshi Ekko, Toyama (JP); Kaori Inoshima, Toyama (JP); Kazuo Nakaya, Toyama (JP); Osamu Morita, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 883 days.

(21) Appl. No.: 14/022,860

(22) Filed: Sep. 10, 2013

(65) Prior Publication Data
US 2014/0074277 A1 Mar. 13, 2014

(30) Foreign Application Priority Data

Sep. 12, 2012 (JP) .................................. 2012-200463
Jul. 31, 2013 (JP) .................................. 2013-159327

(51) Int. Cl.
*G06F 17/50* (2006.01)
*C23C 16/52* (2006.01)

(52) U.S. Cl.
CPC .............. *G06F 17/50* (2013.01); *C23C 16/52* (2013.01)

(58) Field of Classification Search
CPC ... G06F 17/50; C23C 16/52; H01L 21/67248; H01L 22/20; H01L 21/67098; Y02P 90/20; G05B 19/41865; G05B 2219/32097; G05B 2219/45031
USPC ......................................................... 700/121
See application file for complete search history.

(56) References Cited

U.S. PATENT DOCUMENTS

| | | | |
|---|---|---|---|
| 6,711,452 B1 * | 3/2004 | Ogawa ................ | G03F 7/70508 700/121 |
| 6,975,917 B2 | 12/2005 | Sakamoto et al. | |
| 7,260,443 B2 * | 8/2007 | Morinaga ........ | G05B 19/41865 700/121 |

(Continued)

FOREIGN PATENT DOCUMENTS

| | | |
|---|---|---|
| JP | 2000-133595 A | 5/2000 |
| JP | 2003-109906 A | 4/2003 |

(Continued)

*Primary Examiner* — Jason Lin
(74) *Attorney, Agent, or Firm* — Volpe and Koenig, P.C.

(57) ABSTRACT

Provided is a method of automatically setting, in a recipe, a process parameter (PP) according to the number of substrates to be processed. The method includes (a) displaying a process parameter of a process recipe on a display unit; (b) displaying a parameter name in a process parameter file on the display unit; (c) generating a first recipe by substituting the process parameter with the parameter name; (d) downloading the first recipe and one of a plurality of condition tables corresponding to the selected number of substrates when the number of substrates to be processed in a processing chamber is selected; and (e) generating a second recipe by substituting the process parameter of the downloaded one of the condition tables for the parameter name in the downloaded first recipe.

3 Claims, 11 Drawing Sheets

(56) References Cited

U.S. PATENT DOCUMENTS

| | | | |
|---|---|---|---|
| 7,292,906 B2* | 11/2007 | Funk | H01L 21/67253 257/E21.525 |
| 7,369,913 B2* | 5/2008 | Heminway | G05B 19/41865 700/100 |
| 2002/0055804 A1* | 5/2002 | Betawar | G05B 19/41865 700/117 |
| 2004/0030437 A1* | 2/2004 | Toh | H01L 21/67276 700/121 |
| 2004/0238519 A1* | 12/2004 | Sakamoto | F27D 19/00 219/390 |
| 2006/0020362 A1* | 1/2006 | Morinaga | G05B 19/41865 700/121 |
| 2006/0188240 A1* | 8/2006 | Tanaka | H01L 21/67109 392/416 |
| 2008/0229386 A1* | 9/2008 | Yonebayashi | G06F 21/604 726/1 |
| 2009/0281755 A1* | 11/2009 | Funakoshi | G05B 19/41875 702/84 |
| 2010/0057239 A1* | 3/2010 | Masuda | G05B 19/41865 700/105 |

FOREIGN PATENT DOCUMENTS

| | | |
|---|---|---|
| JP | 2005-093747 A | 4/2005 |
| JP | 3985922 B2 | 7/2007 |

* cited by examiner

FIG. 4

| RECIPE NAME | Test |
|---|---|
| STEP ID | DEPO |
| STEP TIME | 00 : 80 : 00 |
| TEMPERATURE | 850 |
| . | . |
| . | . |
| . | . |

FIG. 5

VP FILE STRUCTURE

| No. | PARAMETER NAME | |
|---|---|---|
| 1 | VP_Time-001 | 60 |
| 2 | VP_Temp-001 | 800.0 |
| ⋮ | ⋮ | ⋮ |
| 30 | VP_SubLoop-001 | 500 |

VP ITEM

PROCESS PARAMETER

FIG. 8

「Test」 RECIPE, 「DEPO」 STEP

| ITEM | SET VALUE |
|---|---|
| STEP TIME | VP_Time-001 |
| TEMPERATURE | 800.0 |
| ⋮ | ⋮ |
| NUMBER OF CYCLES | 500 |

VP FILE

| No. | PARAMETER NAME | |
|---|---|---|
| 1 | VP_Time-001 | 60 |
| 2 | VP_Temp-001 | 800.0 |
| ⋮ | ⋮ | ⋮ |
| 30 | VP_SubLoop-001 | 500 |

# SUBSTRATE PROCESSING APPARATUS, METHOD OF MANUFACTURING SEMICONDUCTOR DEVICE, AND METHOD OF GENERATING RECIPE

CROSS-REFERENCE TO RELATED PATENT APPLICATION

This U.S. non-provisional patent application claims priority under 35 U.S.C. §119 of Japanese Patent Application No. 2012-200463, filed on Sep. 12, 2012, and Japanese Patent Application No. 2013-159327, filed on Jul. 31, 2013 in the Japanese Patent Office, the entire contents of which are hereby incorporated by reference.

BACKGROUND OF THE INVENTION

1. Field of the Invention

The present invention relates to a method of generating a recipe which substitutes process parameters set in a parameter file for process parameters such as a processing time, a processing temperature, and the like, which are set in a recipe for processing a substrate, a substrate processing apparatus which executes the generated recipe, and a method of manufacturing a semiconductor device which uses the generated recipe.

2. Description of the Related Art

In a substrate processing apparatus such as a vertical film-forming device or the like, a boat equipped with a plurality of (several tens to hundreds of) substrates is accommodated in a processing chamber, a pressure or a temperature inside the processing chamber is set as a predetermined value by heating a process gas while supplying the process gas, and various kinds of processes are performed on a substrate surface using a chemical vapor deposition (CVD) method and the like. When introducing the process gas into a processing furnace to process the introduced process gas in a state in which substrates with different film thicknesses, for example, a dummy substrate and a product substrate are mixed in such a substrate processing apparatus, a film thickness deposited on the product substrate varies with an accumulated film thickness deposited on the boat, a furnace wall of the processing furnace, and the dummy substrate, or varies with the number of product substrates loaded on the boat. Thus, in order to suppress variation of the film thickness deposited on the product substrate, with regard to the accumulated film thickness, heating control may be performed using a relationship between the accumulated film thickness and a temperature as described in Patent Document 1 below, and with regard to the number of product substrates, a recipe according to the number of product substrates may be generated as described in Patent Document 2 below.

In general, in order to perform desired processing on the product substrate, it is necessary to generate an optimized recipe (process recipe, especially in this case). In this instance, in the process recipe, process parameters such as a processing time, a pressure and a temperature inside a processing chamber, and the like are set. For example, as described in Patent Document 3 below, a recipe is efficiently generated using a common parameter. Here, the common parameter refers to a parameter which is used in a case of setting process parameters having the same numeric value in each processing step of the recipe, and the like. By setting the common parameter in advance, an operation of inputting the process parameters in each processing step can be conveniently omitted.

However, in order to perform film thickness control according to variation of the accumulated film thickness or variation of the number of product substrates, it is necessary to adjust values of the process parameters in detail, but such detailed adjustment is not considered in the above-described common parameter. Thus, when generating a process recipe for performing film thickness control according to variation of the accumulated film thickness or variation of the number of product substrates, many process parameters should be set by manual inputs of an operator, which causes troublesomeness. In addition, it is difficult to remove operator's input errors, and when the process recipe is executed using a wrong process parameter, it is highly likely that the product will be discarded.

1. Japanese Patent Publication No. 2003-109906
2. Japanese Patent Publication No. 2005-093747
3. Japanese Patent Publication No. 2000-133595

SUMMARY OF THE INVENTION

It is an object of the present invention to provide substrate processing technology that can automatically set a process parameter suitable for a process condition of a process recipe before executing the process recipe.

According to one aspect of the present invention, there is provided A control method performed in a substrate processing apparatus including: a processing chamber configured to process a substrate; a recipe storage unit configured to store a process recipe for processing the substrate; a process parameter file storage unit configured to store a process parameter file including a process parameter used in executing the process recipe and a plurality of condition tables storing a parameter name of the process parameter according to number of substrate to be processed in the processing chamber; a control unit configured to execute the process recipe; and a display unit configured to display at least the process parameter and the parameter name, the control method including: (a) displaying the process parameter of the process recipe on the display unit; (b) displaying the parameter name in the process parameter file on the display unit; (c) generating a first recipe by substituting the process parameter with the parameter name; (d) downloading the first recipe and one of the plurality of condition tables corresponding to the number of substrate when the number of substrate to be processed in the processing chamber is selected; and (e) generating a second recipe by substituting the parameter name in the first recipe downloaded in the step (d) with the process parameter in the one of the plurality of condition tables downloaded in the step (d).

According to another aspect of the present invention, there is provided a method of manufacturing a semiconductor device including: (a) displaying a process parameter of a recipe used in processing a substrate; (b) displaying a parameter name of the process parameter in a condition table storing the process parameter and the process name of the process parameter according to number of substrate to be processed; (c) generating a first recipe by substituting the process parameter with the parameter name; (d) generating a second recipe by substituting the parameter name in the first recipe with the process parameter in the condition table when the number of substrate to be processed is selected; and (e) executing the second recipe according to the number of substrate selected in the step (d).

According to another aspect of the present invention, there is provided a method of generating a recipe of a substrate processing apparatus, including: (a) displaying a process parameter of a recipe used in processing a substrate;

(b) displaying a parameter name of the process parameter in a condition table storing the process parameter and the process name of the process parameter according to number of substrate to be processed; and (c) generating a first recipe by substituting the process parameter with the parameter name.

BRIEF DESCRIPTION OF THE DRAWINGS

FIG. 4 is an example of a recipe display screen according to an embodiment of the present invention.

FIG. 5 is a structure of a VP file according to an embodiment of the present invention.

FIG. 8 is a view showing a change in a recipe in accordance with a VP process according to an embodiment of the present invention.

DETAILED DESCRIPTION OF PREFERRED EMBODIMENTS

Figure 1:
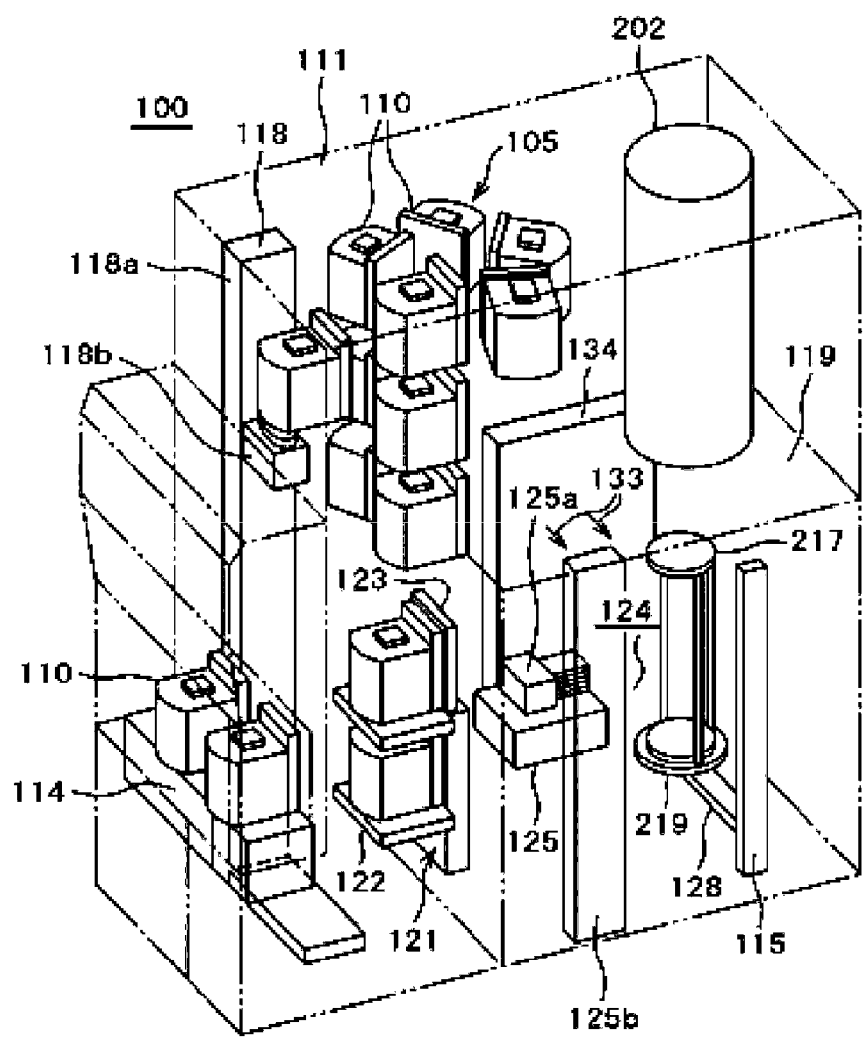
FIG. 1 is a perspective view showing a substrate processing apparatus according to an embodiment of the present invention.

A substrate processing apparatus according to an embodiment of the present invention will now be described with reference to the accompanying drawings. The substrate processing apparatus according to the present embodiment is configured as a semiconductor manufacturing apparatus that performs processes in a method of manufacturing a semiconductor device (IC: Integrated Circuit) as an example. In addition, in the following descriptions, a case in which a batch type vertical semiconductor manufacturing apparatus (hereinafter, simply referred to as a processing apparatus) that performs oxidation, diffusion treatment, CVD treatment, or the like on a substrate is applied as a substrate processing apparatus will be described below. In FIG. 1, a perspective view of a processing apparatus to which the present invention is applied is shown. In addition, FIG. 2 is a side perspective view of the processing apparatus shown in FIG. 1.

Figure 2:
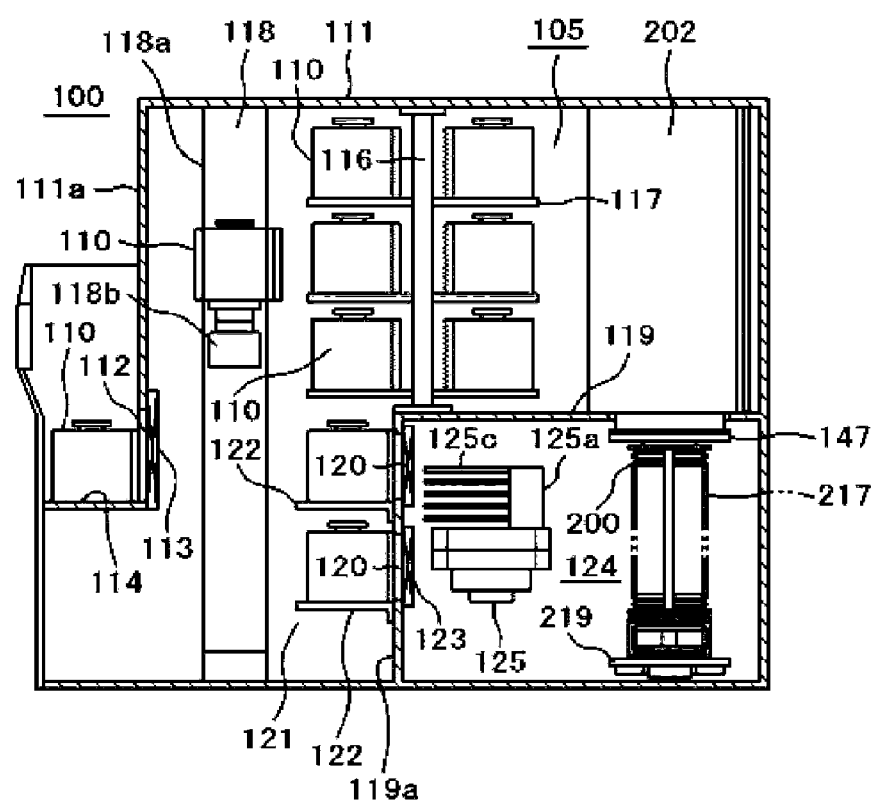
FIG. 2 is a side perspective view showing a substrate processing apparatus according to an embodiment of the present invention.

As shown in FIGS. 1 and 2, a processing apparatus 100 according to the present embodiment uses a pod 110 as a wafer carrier that stores a wafer 200 (substrate) made of silicon or the like, and includes a housing 111. A pod load/unload port 112 is installed in a front surface wall 111a of the housing 111 in order to communicate the inner side and the outer side of the housing 111, and the pod load/unload port 112 is opened and closed by a front shutter 113. A load port 114 is installed on a front side of a front surface of the pod load/unload port 112, and the load port 114 places the pod 110. The pod 110 is loaded onto the load port 114 by a transfer device (not shown) in the process, and is also unloaded from the load port 114.

A rotating shelf 105 is installed in an upper portion of a substantially central portion in the front and rear direction in the housing 111, rotated about a support post 116, and stores a plurality of pods 110 on a shelf plate. As shown in FIG. 2, a pod transfer device 118 is installed between the load port 114 and the rotating shelf 105 in the housing 111. The pod transfer device 118 includes a pod elevator 118a that is liftable while retaining the pod 110 and a pod transfer mechanism 118b as a horizontal transfer mechanism, and transfers the pod 110 between the load port 114, the rotating shelf 105, and a pod opener 121.

As shown in FIG. 2, in a lower portion of a substantially central portion in the front and rear direction in the housing 111, a sub housing 119 is built over a rear end. In a front surface wall 119a of the sub housing 119, a pair of wafer load/unload ports 120 for carrying the wafer 200 in and out of the sub housing 119 are arranged in two upper and lower stages in a vertical direction, and a pair of pod openers 121 and 121 are installed respectively in the upper and lower wafer load/unload ports 120 and 120. The pod opener 121 includes placing tables 122 and 122 for placing the pod 110 and cap attaching/detaching mechanisms 123 and 123 for attaching/detaching a cap (lid) of the pod 110. The pod opener 121 opens and closes a wafer inlet and outlet of the pod 110 by attaching/detaching the cap of the pod 110 placed on the placing tables 122 using the cap attaching/detaching mechanism 123. The placing table 122 is a transferring shelf in which a substrate container is placed when transferring a substrate.

As shown in FIG. 2, the sub housing 119 includes a conveying chamber 124 that is isolated from an atmosphere of an installation space of the pod transfer device 118 or the rotating shelf 105. A wafer conveying mechanism 125 is installed in a front region of the conveying chamber 124. The wafer conveying mechanism 125 includes a wafer conveying device 125a that is rotatable or linearly movable in a horizontal direction by placing the wafer 200 in tweezers 125c and a wafer transfer device elevator 125b for elevating the wafer conveying device 125a. By continuous operations of the wafer transfer device elevator 125b and the wafer conveying device 125a, the wafer 200 may be loaded on and unloaded from a boat 217.

As shown in FIG. 1, a clean unit 134 including a supply fan and a dustproof filter is installed in the conveying chamber 124 so as to supply clean air 133 that is a purified atmosphere or an inert gas. As shown in FIG. 2, a processing furnace 202 is installed above the boat 217. The processing furnace 202 includes a substrate processing chamber (not shown, hereinafter, referred to as processing chamber) formed therein and a heater (not shown) formed around the processing chamber so as to heat an inside of the processing chamber. A lower end of the processing furnace 202 is opened and closed by a furnace opening gate valve 147.

As shown in FIG. 1, a boat elevator 115 for elevating the boat 217 is installed. A seal cap 219 is horizontally mounted in an arm 128 connected to the boat elevator 115, and vertically supports the boat 217 so as to close a lower end of the processing furnace 202. The boat 217 is a substrate holder including a plurality of retainers, and horizontally retains a plurality of wafers 200 (for example, about 50 to 125 wafers) in a state in which the wafers 200 are vertically arranged by aligning centers of the wafers 200. In addition, the plurality of wafers are mounted respectively in an upper end and a lower end of the boat 217, and a product wafer is mounted between an upper dummy wafer and a lower dummy wafer. During a batch process that is performed several times while replacing the product wafer, the same dummy wafer is used.

Next, operations of the processing apparatus according to the present embodiment will be described. As shown in FIGS. 1 and 2, when the pod 110 is supplied to the load port 114, the pod load/unload port 112 is opened by the front shutter 113 so that the pod 110 is carried-into and out the pod load/unload port 112. The load pod 110 is automatically transferred and delivered to the specified shelf plate 117 of the rotating shelf 105 along the pod transfer device 118.

The pod 110 is temporarily stored in the rotating shelf 105, and then transferred to one pod opener 121 from a shelf plate 117 to be conveyed to the placing table 122 or transferred to the pod opener 121 directly from the load port 114 to be conveyed to the placing table 122. In this instance, the wafer load/unload port 120 of the pod opener 121 is closed by the cap attaching/detaching mechanism 123, and the clean air 133 is circulated and filled in the conveying chamber 124.

As shown in FIG. 2, in the pod 110 placed on the placing table 122, the cap of the pod 110 is removed by the cap attaching/detaching mechanism 123 so that the wafer inlet and outlet of the pod 110 is opened. In addition, the wafer 200 is picked up by the wafer conveying device 125a from the pod 110 and conveyed and loaded into the boat 217. The wafer conveying device 125a that has delivered the wafer 200 to the boat 217 returns to the pod 110 and loads a next wafer 200 into the boat 217.

While loading the wafer 200 into the boat 217 by the wafer conveying device 125a in the one (upper or lower) pod opener 121, the other pod 110 is transferred from the rotating shelf 105 or the load port 114 by the pod transfer device 118 in the other (upper or lower) pod opener 121 and, at the same time, the pod 110 is opened by the pod opener 121.

When the number of wafers 200 selected in advance are loaded into the boat 217, a lower end of the processing furnace 202 is opened by the furnace opening gate valve 147. Subsequently, the seal cap 219 is raised by the boat elevator 115 so that the boat 217 supported by the seal cap 219 is carried into the processing chamber of the processing furnace 202. After loading, an arbitrary treatment is performed on the wafer 200 in the processing chamber. The boat 217 is pulled out by the boat elevator 115 after the treatment, and then the wafer 200 and the pod 110 are dispensed to the outside of the housing 111 approximately in the reverse order of the above procedures.

Figure 3:
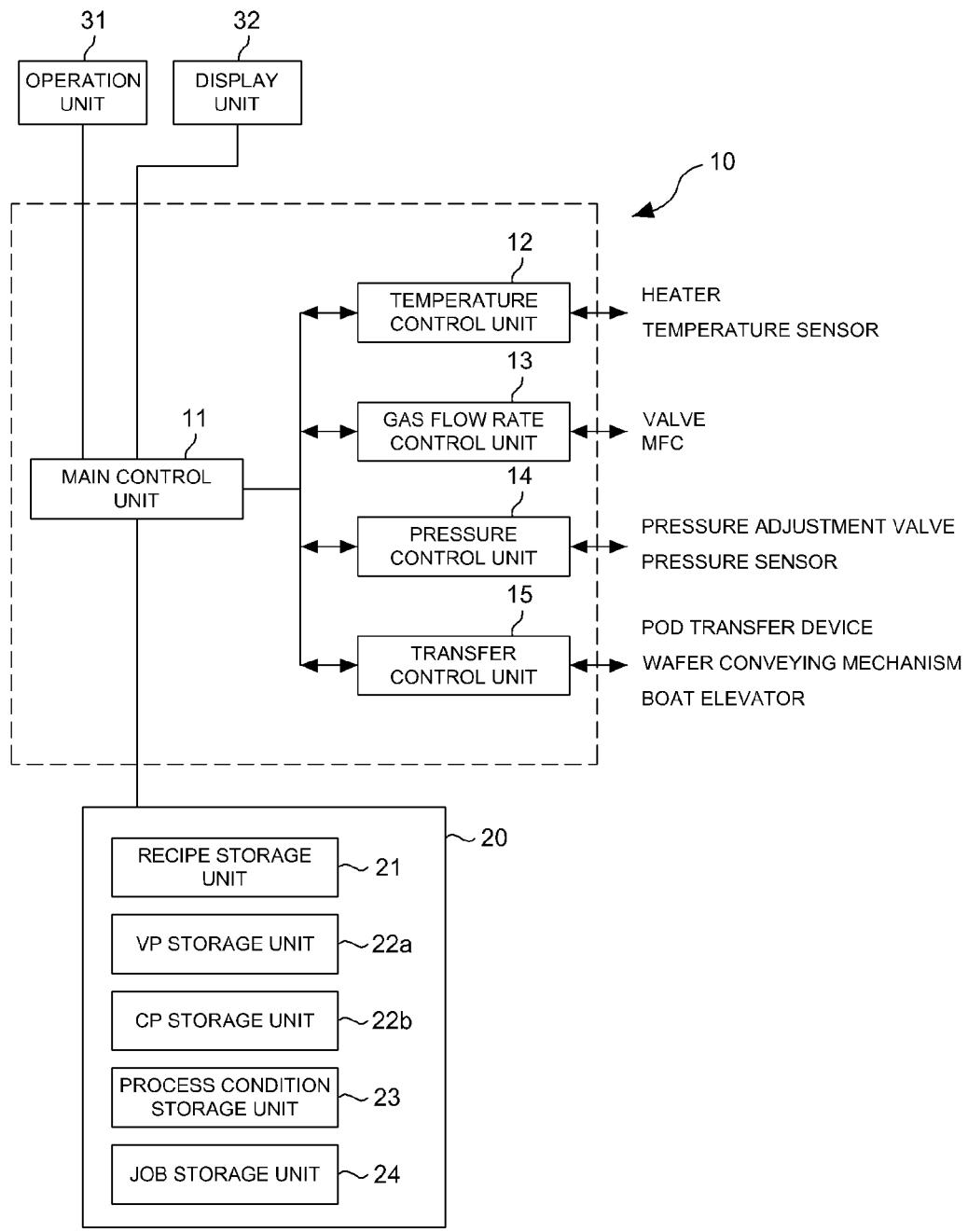
FIG. 3 is an example configuration of a control unit and a storage unit of a substrate processing apparatus according to an embodiment of the present invention.

Next, configurations of a control unit and a storage unit of a substrate processing apparatus will be described with reference to FIG. 3. FIG. 3 shows an example configuration of the control unit and the storage unit of the substrate processing apparatus according to an embodiment of the present embodiment. As shown in FIG. 3, the control unit 10 includes a main control unit 11, a temperature control unit 12, a gas flow rate control unit 13, a pressure control unit 14, and a transfer control unit 15. Components included in the substrate processing apparatus 100 such as the temperature control unit 12, the gas flow rate control unit 13, the pressure control unit 14, the transfer control unit 15, an operation unit 31 that receives an instruction of an operator, a display unit 32 that displays information such as an operation screen, various data, and the like, a storage unit 20 that stores a process recipe that is a substrate processing sequence of the substrate processing apparatus 100, and the like are electrically connected to the main control unit 11. For example, in a case of a touch panel, the operation unit 31 and the display unit 32 are integrally formed.

The temperature control unit 12 controls a temperature of a heater for heating a reaction furnace 202, receives temperature data from a temperature sensor for measuring a temperature inside the processing furnace 202, and transmits the received data to the main control unit 11. In addition, the temperature control unit 12 receives, from the main control unit 11, a heating temperature indication of the heater for increasing the temperature inside the processing furnace 202, and heats the heater so that the indicated temperature can be obtained.

The gas flow rate control unit 13 receives flow rate data of a gas from, for example, a mass flow controller (MFC) provided in a processing gas supply pipe for supplying a processing gas into the processing furnace 202, and transmits the received data to the main control unit 11. In addition, the gas flow rate control unit 13 receives, from the main control unit 11, a gas control instruction such as a valve opening/closing instruction to, for example, an opening/closing valve provided in the processing gas supply pipe, a pump driving instruction, or the like, and performs gas flow rate control in accordance with the above-described instruction.

The pressure control unit 14 receives pressure information inside the processing furnace 202 from a pressure sensor provided in an exhaust pipe for exhausting a gas from the processing furnace 202, and transmits the received information to the main control unit 11. In addition, the pressure control unit 14 receives, from the main control unit 11, a valve opening indication or a pump driving instruction to a pressure adjustment valve or a pump provided in the exhaust pipe, and performs control of a pressure inside the processing furnace 202 in accordance with the above-described instruction. Thus, the control unit 10 controls the pressure inside the processing furnace by the pressure adjustment device based on a pressure detected by the pressure sensor at the desired timing when a desired pressure can be obtained.

The transfer control unit 15 controls a position of the pod transfer device 118, the wafer conveying mechanism 125, or the boat elevator 115. A photo sensor (not shown) or a pod sensor (not shown) is electrically connected to the transfer control unit 15, receives data such as presence and absence of the pod 110 for accommodating the wafer 200 or a position thereof, and transmits the received data to the main control unit 11. In addition, the transfer control unit 15 receives a transfer instruction of the pod 110, the boat 217, or the wafer 200 from the main control unit 11, and transfers the pod 110, the boat 217, or the wafer 200 to an indicated location or position.

The main control unit 11 includes a memory for storing operation programs of a central processing unit (CPU) and the main control unit 11, and the like as a hardware configuration. The CPU downloads and executes a recipe stored in the storage unit 20 to the memory in accordance with the operation program based on an operator's instruction from the operation unit 31. In this instance, the main control unit 11 controls each control unit such as the temperature control unit 12, the gas flow rate control unit 13, the pressure control unit 14, and the transfer control unit 15 to measure the temperature, the pressure, and the gas flow rate inside the processing furnace, to output control signals based on the measured data, and to operate in accordance with the recipe.

The storage unit 20 includes an EEPROM, a flash memory, a hard disk, and the like, and includes a storage medium for storing the operation program of the CPU and a storage medium for storing the recipe. The operation program stored in the storage unit 20 is transmitted to the memory of the main control unit 11 to operate when the substrate processing apparatus is raised.

As shown in FIG. 3, the storage unit 20 includes at least a recipe storage unit 21, a variable parameter (VP) storage unit 22a, a condition parameter (CP) storage unit 22b, a process condition storage unit 23, and a job storage unit 24. The VP storage unit 22a and the CP storage unit 22b are collectively referred to as a process parameter file storage unit 22.

The recipe storage unit 21 stores a plurality of recipes including a process recipe for performing a substrate treatment, for example, a recipe A for performing film-forming of a film thickness A on a surface of the wafer 200, a recipe B for performing film-forming of a film thickness B on the surface of the wafer 200, and the like. A single recipe usually includes a plurality of processing operations, and each processing operation includes a plurality of process parameters for processing a substrate. An example of the recipe is shown in FIG. 4. FIG. 4 is an example of a recipe display screen according to an embodiment of the present invention, and in FIG. 4, a state in which a part of a recipe configuration is displayed on the display unit 32 is simply shown. In the example of FIG. 4, a recipe name that is an ID (identifier) for specifying a recipe is "Test". In addition, in a step in which a step ID for specifying a processing step is "DEPO", a step time (80 minutes) that is a time required for the corresponding step, a temperature (850° C.) inside the processing furnace in the corresponding step, and the like are shown.

In addition, the recipe storage unit 21 includes a combination information unit (not shown) for storing an ID for specifying a VP file or a CP file corresponding to each recipe, for example, a VP file name or a CP file name.

The VP storage unit 22a stores one or a plurality of VP files shown in FIG. 5. FIG. 5 shows a structure of a VP file according to an embodiment of the present invention. The VP file shown in FIG. 5 includes 30 VP items as a parameter item that is an item of a process parameter. For example, a VP item (a parameter name being "VP Time-001") of No. 1 is a step time, and the process parameter is 60 minutes. A VP item (a parameter name being "VP Temp-001") of No. 2 is a temperature of the processing furnace, and the process parameter is 800.0° C. Thus, the VP file includes a plurality of combinations between the process parameter for processing the substrate and a parameter name that is an item name of the process parameter.

Figure 6:
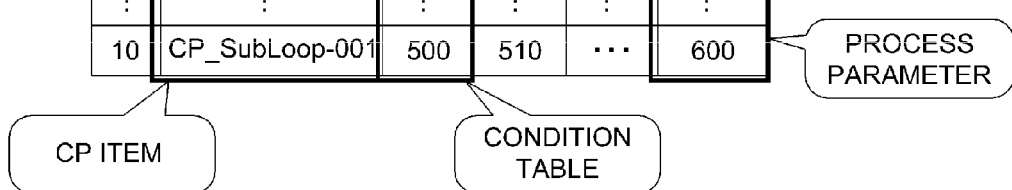
FIG. 6 is a structure of a CP file according to an embodiment of the present invention.

The CP storage unit 22b stores one or a plurality of CP files shown in FIG. 6. FIG. 6 shows a structure of a CP file according to an embodiment of the present invention. A CP file shown in FIG. 6 includes 10 CP items as a parameter item as shown in the vertical direction of FIG. 6, and a plurality of process conditions (the number of product substrates in the example of FIG. 6) as shown in the horizontal direction of FIG. 6. For example, a CP item (parameter name being "CP Time-001") of No. 1 is a step time, and a CP item (parameter name being "CP Temp-001") of No. 2 is a temperature inside the processing furnace. When the number of product substrates is 0 to 10, the process parameter of the step time is 60 minutes, and the process parameter of the temperature inside the processing furnace is 800.0° C. In addition, when the number of product substrates is 11 to 20, the process parameter of the step time is 70 minutes, and the process parameter of the temperature inside the processing furnace is 810.0° C.

The CP file includes a condition table (CP table) that is set so that the process parameter corresponding to each of a plurality of CP items coincides with an optimized process parameter according to each process condition (for example, the number of product substrates). That is, the condition table of the CP file stores the process parameter in accordance with the number of substrates in a substrate holder and a parameter name of the process parameter. In an example of FIG. 6, the CP file includes a plurality of condition tables corresponding to different numbers of substrates. For example, when the number of product substrates is 0 to 10, the condition table (CP table) includes process parameters of CP items of No. 1 to No. 10 corresponding to the case in which the number of product substrates is 0 to 10. Contents (stored data) of the process parameter file storage unit 22 are displayed on the display unit 32. An operator may set or change the contents of the process parameter file storage unit 22 displayed on the display unit 32.

The process condition storage unit 23 stores process conditions such as the number of product substrates in the boat 217 in a job to be executed, an accumulated film thickness deposited on the boat 217, a furnace wall of the processing furnace 202, or a dummy substrate, and the like, as process condition management information. The process condition management information may be set by an operator's input from the operation unit 31. The job refers to a series of processes including loading a plurality of product substrates in the boat 217 and carrying the loaded product substrates into the processing furnace 202 to process the product substrates inside the processing furnace 202, and then carrying the processed product substrates out of the processing furnace and taking the product substrates out the boat 217.

The job storage unit 24 stores a recipe name used in the job to be executed, a start order or a start time of the job. The job is specified by an automatically generated ID referred to as a job ID. The job storage unit 24 stores the job ID, "Test", which is a recipe name, a serial number "002" for indicating a start order, or a start time "14:00", by associating them with each other.

First Embodiment

Next, a first embodiment that substitutes a process parameter of a recipe with a process parameter of a VP file will be described with reference to FIGS. 7 and 8.

Figure 7:
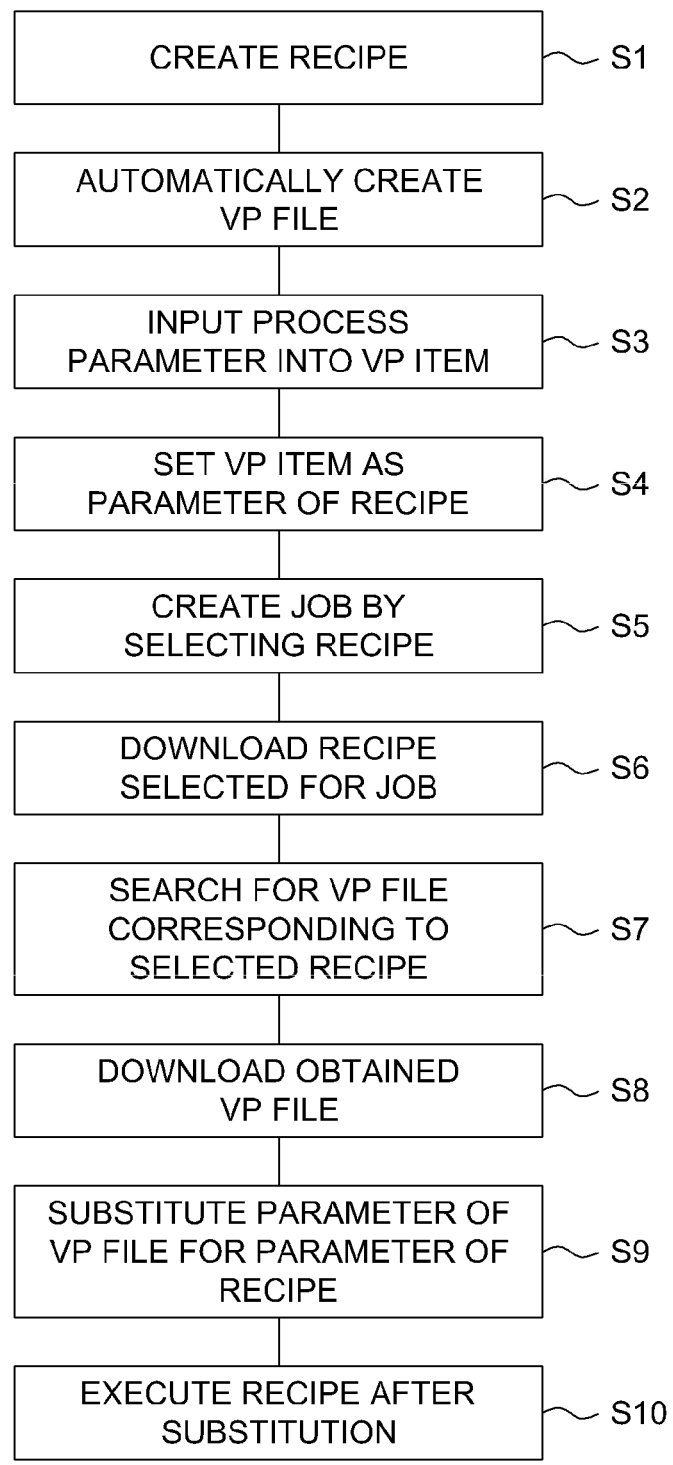
FIG. 7 is a summary of a VP process according to an embodiment of the present invention.

FIG. 7 is a summary of a VP process according to the first embodiment of the present invention, and FIG. 8 is a view showing a change in a recipe according to the first embodiment of the present invention. The VP process according to the first embodiment is controlled by the main control unit 11 rather than operator manipulation.

In operation S1 of FIG. 7, an operator first generates a recipe using the operation unit 31, and gives a recipe name (for example, "Test") to the generated recipe. Next, in operation S2, the main control unit 11 automatically generates a frame of a VP file having the same name as the recipe name. In this instance, the automatically generated VP file name is registered in the combination information unit. In a state in which a VP editing screen including the VP file frame is displayed on the display unit 32, the operator inputs a parameter item (VP item) and a process parameter in the VP file frame using the operation unit 31 to set the VP item and the process parameter. As a result, the VP file shown in FIG. 5 is generated. In operation S3, the generated VP file is stored in the VP storage unit 22a together with the file name (for example, "Test"). The VP file name may be different from the recipe name.

The VP item and the process parameter registered in the VP file are required to be linked to the recipe. Therefore, in operation S4, a corresponding VP item is set as the process parameter of the recipe by writing the VP item in the process parameter of the recipe. Specifically, in a recipe display operation, a recipe on which a VP process is to be performed is first read from the recipe storage unit 21, and a recipe screen corresponding to an operation for performing the VP process of the recipe is displayed on the display unit 32. Next, an operator selects an item of the process parameter on which VP setting (that is, to be replaced by a VP item) is to be performed from the process parameters of the displayed recipe.

For example, an operator selects "step time" as an item desired to be replaced by a VP item in the recipe screen of the step whose step ID is "DEPO", in the recipe whose recipe name is "Test", as shown in FIG. 4. Next, a VP/CP selection screen for selecting whether VP setting or CP setting is performed is displayed on the display unit 32. The CP setting will be described later. When the operator pushes a VP button in the VP/CP selection screen, the VP setting is selected, and a VP file in which a VP file name registered in the combination information unit is "Test" is read from the VP storage unit 22a to be displayed on the display unit 32. Next, in a parameter name display operation, a VP item selection screen for selecting the VP item registered in the VP file is displayed on the display unit 32.

In a recipe parameter substitution operation, when any VP item, for example, "VP Time-001", is selected in the VP item selection screen by the operator, as shown in FIG. 8, the selected parameter name "VP Time-001" is written instead of the process parameter of the operation of the recipe. Thus, the VP item of the VP file is set in the process parameter of the recipe.

In addition, when substituting another process parameter of the recipe with the VP item, the parameter name display operation and the recipe parameter substitution operation are repeatedly performed while displaying the recipe screen. For example, when substituting "temperature" of the recipe with the VP item, "temperature" is selected from the recipe screen of the step whose step ID is "DEPO" in the recipe whose recipe name is "Test", as shown in FIG. 4. Next, when "VP Temp-001" as the VP item is selected from the VP item selection screen by the operator, "VP Temp-001" is written in the process parameter. Thus, the recipe in which the VP item is set is stored in the recipe storage unit 21.

Next, in operation S5, the recipe in which the VP item is set is selected, and a job for performing a substrate process is generated. Specifically, the operator stores a job ID in the job storage unit 24 together with a corresponding recipe name and a start number of the job, using the operation unit 31.

Next, in operation S6, the main control unit 11 downloads the recipe selected in the job to the memory of the main control unit 11 to start to execute the job. In addition, in operation S7, the main control unit 11 searches for the VP file corresponding (combined) to the recipe selected in the job based on a VP file name registered in the combination information unit of the recipe, and in operation S8, downloads the obtained VP file to the memory of the main control unit 11.

Next, in operation S9, the main control unit 11 substitutes the parameter name set in the process parameter of the recipe downloaded to the memory of the main control unit 11 with the process parameter of the VP file. Specifically, the main control unit 11 substitutes the process parameter (parameter name) in which the VP item is set in the process parameter of the downloaded recipe with the process parameter (numeric value) corresponding to the VP item of the downloaded VP file.

For example, as shown in FIG. 8, "VP Time-001" is set as the process parameter of "step time" in the "DEPO" step of the "Test" recipe. In addition, as shown in FIG. 8, the process parameter "60", which is the process parameter corresponding to the VP item "VP Time-001" of the VP file is substituted for the process parameter of the "Test" recipe in which "VP Time-001" is set. In addition, when "VP Temp-001" is set as the process parameter of "temperature" in the "DEPO" step of the "Test" recipe, the process parameter "800", which is the process parameter corresponding to the VP item "VP Temp-001" of the VP file is substituted for the process parameter of the "Test" recipe in which "VP Temp-001" is set. Next, in operation S10, the process parameter of the recipe is substituted as described above, and then the recipe is executed.

In the above-described embodiment, the recipe is downloaded in operation S6, the VP file is searched for in operation S7, and then the obtained VP file is downloaded in operation S8. However, the VP file may be searched for, and then the obtained VP file may be downloaded together with the recipe. In addition, in the above-described embodiment, a single VP file is combined for a single recipe, but a plurality of VP files may be combined for a single recipe. For example, a single VP file may be combined for one operation.

According to the first embodiment described above, at least the following (1) to (3) effects may be obtained.

(1) It is possible to automatically input a process parameter suitable for a process condition of a process recipe before executing the process recipe. Accordingly, it is possible to suppress an input error of the process parameter by an operator.

(2) It is easy to share the process parameter of the VP file in a plurality of recipes or a plurality of processing operations.

(3) Since the VP item name is set in the process parameter of the recipe in advance, and before executing the recipe, the process parameter of the recipe in which the VP item name is set is replaced with the process parameter of the VP item in the VP file, it is easy to substitute the process parameter of the VP file for the process parameter of the recipe.

Second Embodiment

Figure 9:
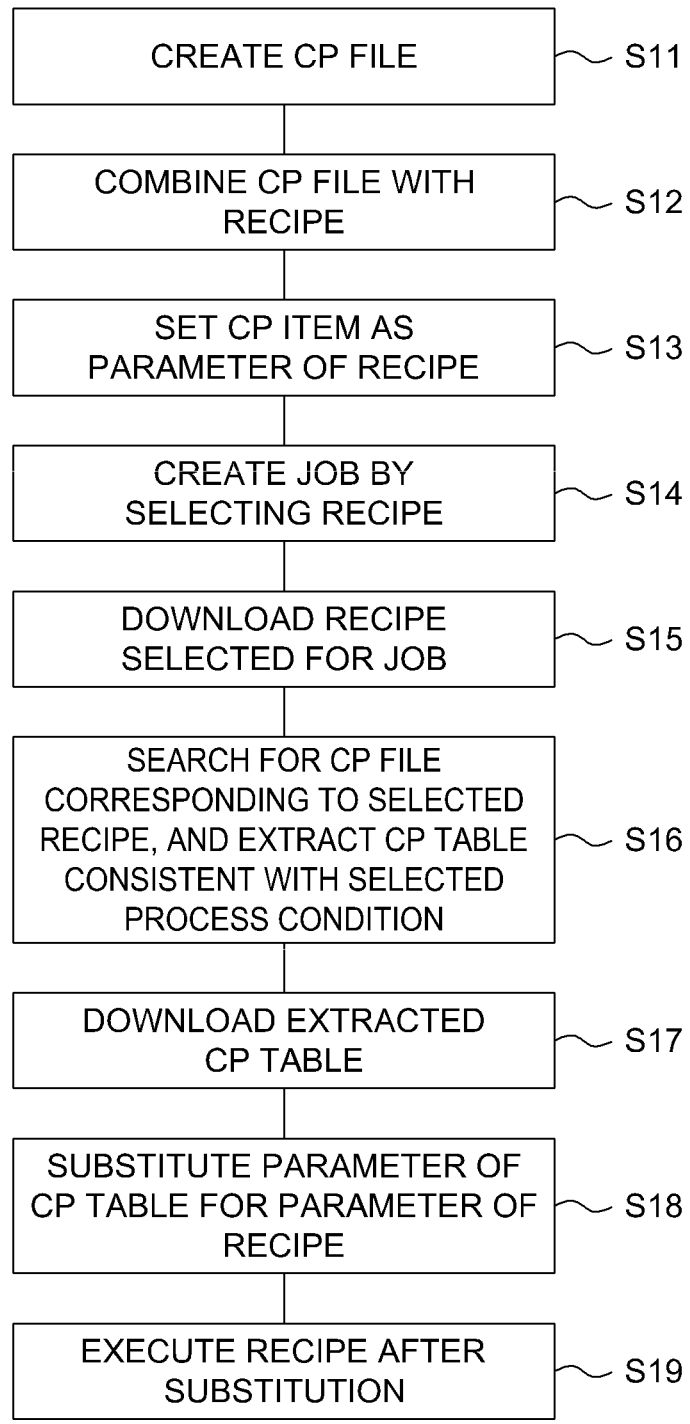
FIG. 9 is a summary of a CP process according to an embodiment of the present invention.
Figure 10:
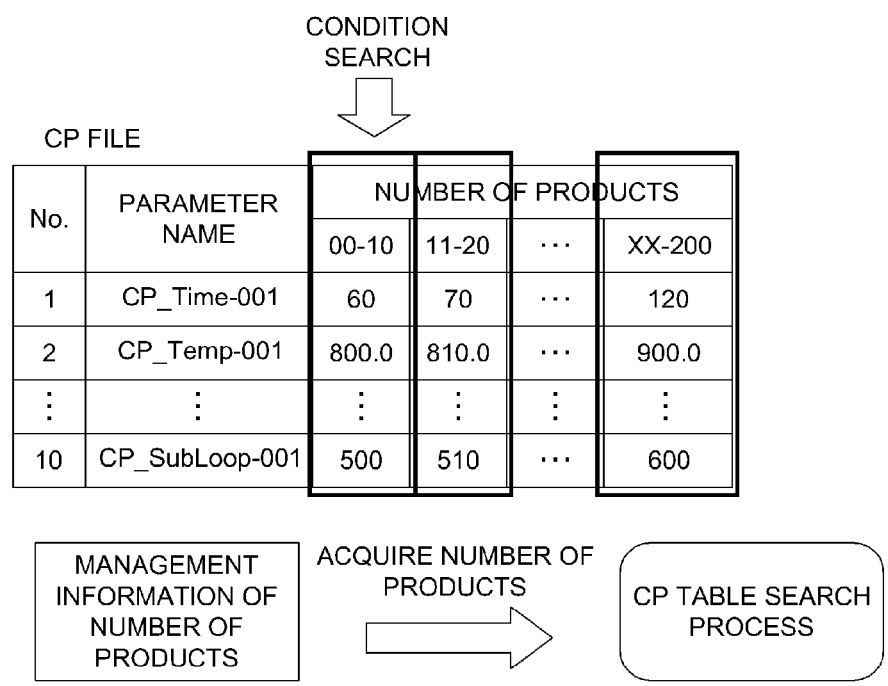
FIG. 10 is a view showing a CP table searching process according to an embodiment of the present invention.
Figure 11:
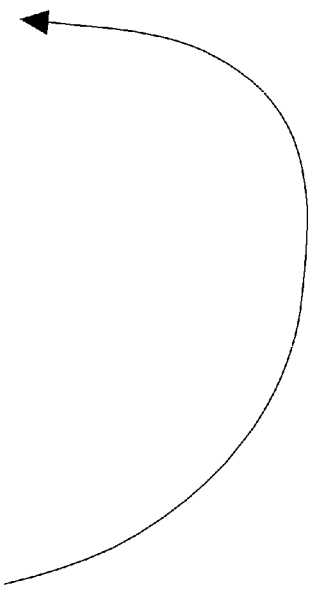
FIG. 11 is a view showing a change in a recipe according to a CP process according to an embodiment of the present invention.

Next, a second embodiment that substitutes a process parameter of a CP file for a process parameter of a recipe in accordance with a process condition will be described with reference to FIGS. 9 to 11. In the second embodiment, the number of product substrates is also included in the process condition. FIG. 9 is a summary of a CP process according to a second embodiment of the present invention, FIG. 10 is a view showing a CP table searching process according to the second embodiment of the present invention, and FIG. 11 is a view showing a change according to the second embodiment of the present invention. A CP process according to the second embodiment is controlled by the main control unit 11 rather than operator manipulation.

First, in operation S11, an operator generates a CP file as shown in FIG. 6 using the operation unit 31 while displaying a CP editing screen on the display unit 32. The CP file is stored in the CP storage unit 22b together with the file name. As described above, a process parameter corresponding to each of a plurality of CP items is stored in the CP file as a condition table (CP table) for each process condition (the number of product substrates).

The CP item and the process parameter stored in the CP file are required to be linked to a recipe. Therefore, in operation S12, the CP file is first associated (combined) with the recipe. Specifically, by selecting CP setting while displaying a recipe editing screen on the display unit 32, the CP file name is registered in the combination information unit. Next, in operation S13, the CP item is written in the process parameter of the recipe. Specifically, the recipe on which a CP process is to be performed is read from the recipe storage unit 21, a recipe screen in an operation for performing the CP process in the recipe is displayed on the display unit 32 in a recipe display operation, and an item of the process parameter on which CP setting (that is, replaced by a CP item) is desired to be performed is selected by an operator while displaying the recipe screen.

For example, as shown in FIG. 4, "step time" is selected as an item of the process parameter desired to replaced by the CP item in the recipe screen of a step whose step ID is "DEPO" in the recipe whose recipe name is "Test". Then, in the same manner as the first embodiment, a VP/CP selection screen for selecting whether VP setting or CP setting is performed is displayed on the display unit 32. When the operator pushes a CP button in the VP/CP selection screen, CP setting is selected, and a CP file of the CP file name "Test" registered in the combination information unit is read from the CP storage unit 22b to be displayed on the display unit 32. Thus, in a parameter name display operation, a CP item selection screen for selecting the CP item registered in the CP file is displayed on the display unit 32.

In a recipe parameter substitution operation, when the operator selects a desired CP item, for example, "CP Time-001" from the CP item selection screen, the selected parameter name "CP Time-001" is written instead of the process parameter of the above-described operation in the recipe as shown in FIG. 11. Thus, the CP item of the CP file is set in the process parameter of the recipe.

In addition, when desiring to set the CP item in another process parameter item in the recipe, the parameter display operation and the recipe parameter substitution operation are repeatedly performed in the above-described recipe screen. For example, when desiring to set the CP item in "Temperature" of the recipe, "temperature" is selected from the recipe screen of a step whose step ID is "DEPO" in the recipe whose recipe name is "Test", as shown in FIG. 4. Next, when the operator selects "CP Temp-001" as the CP item from the CP item selection screen, "CP Temp-001" is written instead of the process parameter of the above-described operation in the recipe. Thus, the recipe in which the CP item is set is stored in the recipe storage unit 21.

Next, in operation S14, the recipe in which the CP item is set is selected, and a job for performing a substrate process is generated. Specifically, the operator associates the recipe name and a start number of the job with each other using the operation unit 31 to store the associated information in the job storage unit 24.

Next, in operation S15, when executing the generated job, the main control unit 11 downloads the recipe selected in the job to the memory of the main control unit 11. In addition, in operation S16, the main control unit 11 searches for the CP file corresponding (combined) to the recipe selected in the job based on the CP file name registered in the combination information unit, and extracts a CP table corresponding to the number of product substrates that is the process condition selected in the job from the obtained CP file. In operation S17, the extracted CP table is downloaded to the memory of the main control unit 11.

For example, as shown in FIG. 10, the number of product substrates of the job, for example, 15 product substrates, is acquired from management information of the number of products of the process condition storage unit 23. Next, the CP file is searched for as the process condition that is 15 product substrates, and the CP table when the number of product substrates is 11 to 20 is extracted. The CP table shown in FIG. 11 is obtained by extracting the process parameter corresponding to 11 to 20 product substrates from the process parameter corresponding to each CP item of the CP file.

Next, in operation S18, the main control unit 11 substitutes the parameter name set in the process parameter of the recipe downloaded to the memory of the main control unit 11 with the process parameter of the CP table. Specifically, the main control unit 11 substitutes the process parameter (parameter name) in which the CP item is set in the downloaded recipe with the process parameter corresponding to the CP item in the downloaded CP table.

For example, as shown in FIG. 11, when "CP Time-001" is set in the process parameter of "step time" of a "DEPO" step of a "Test" recipe, the process parameter"70", which is the process parameter corresponding to the CP item "CP Time-001" of the CP table as shown in FIG. 11 is substituted for the process parameter of the "Test" recipe in which "CP Time-001" is set. In addition, when "CP Temp-001" is set in the process parameter such as "temperature" in the "DEPO" step of the "Test" recipe, the process parameter "810", which is the process parameter corresponding to the CP item "CP Temp-001" of the CP table is substituted for the process parameter of the "Test" recipe in which "CP Temp-001" is set. Next, in operation S19, after the substitution of the process parameter of the recipe, the recipe is executed.

In the above-described embodiment, the recipe is downloaded in operation S15, the CP file is searched for using the number of product substrates to extract the CP table in operation S16, and then the extracted CP table is downloaded in operation S17. However, the CP table may be extracted, and then the extracted CP table may be downloaded together with the recipe. In addition, in the above-described embodiment, a single CP file is combined for a single recipe, but the present invention is not limited thereto. For example, a single CP file may be combined for a plurality of kinds of recipes. Conversely, a plurality of kinds of CP files may be combined for a single recipe. In addition, in the above-described embodiment, the number of product substrates is used as the process condition, but the number of substrates including dummy substrates and product substrates may be used as the process condition depending on the process.

According to the second embodiment described above, at least the following (4) to (7) effects may be obtained together with the (1) effect of the first embodiment.

(4) Since the process parameter suitable for the process condition such as the number of product substrates or an accumulated film thickness is automatically selected by the substrate processing apparatus when executing the recipe, it is possible to suppress a process parameter setting error of the operator. In addition, it is easy to control the number of product substrates or the film thickness corresponding to changes such as the accumulated film thickness, thereby preventing the product substrate from being discarded.

(5) It is easy to share the process parameter of the CP file in a plurality of recipes or a plurality of processing operations.

(6) Since the CP item name is set in the process parameter of the recipe in advance, and the process parameter of the recipe in which the CP item name is set is replaced with the process parameter of the CP item of the CP file when executing the recipe, it is easy to substitute the process parameter of the recipe for the process parameter of the CP file.

(7) Since only the CP table suitable for the process condition among a plurality of CP tables of the CP file is downloaded to the memory of the main control unit, and the CP table that is not suitable for the process condition is not downloaded, an execution time of the job can be reduced.

The present invention is not limited to the above-described embodiments, and various changes may be possible without departing from the essence of the present invention. The control unit, the operation unit, the display unit, or the storage unit which performs the VP process according to the first embodiment and the CP process according to the second embodiment is not dedicated for the substrate process apparatus, and may be realized using a general computer system such as a personal computer (PC). For example, by installing a program for executing the above-described process in a general-purpose computer from a recording medium (flexible disk, CD-ROM, USB memory, and the like) in which the program is stored, the control unit, the operation unit, the display unit, or the storage unit which performs the above-described process may be configured.

A means for providing the program for executing the above-described process may be arbitrarily selected. Other than providing the program through a predetermined recording medium as described above, it is possible to provide the program through a communication line, a communication network, or a communication system. In this case, the program may be posted on a bulletin board of the communication network, and provided through a network. Thus, the above-described process may be performed by starting the provided program and executing the program under control of an operating system (OS) of the substrate processing apparatus in the same manner as another application program.

In addition, according to the first and second embodiments, in the processing apparatus 100 in which the substrate process is performed in such a manner that the substrate holder loaded with a plurality of substrates is inserted into the processing furnace and the dummy substrate is substituted in accordance with the number of substrates to be processed when processing the substrate, even though the film accumulated on the dummy substrate affects quality of the substrate, it is possible to manage the process parameter in consideration of the number of substrates to be processed and the accumulated film thickness deposited on the inner wall of the processing furnace 202.

Here, as an embodiment (third embodiment) in which the film accumulated on the dummy substrate affects the quality of the substrate, a set-up operation of the processing apparatus 100 will be described.

Third Embodiment

By changing the process condition several times until achieving performance suitable for customer specifications in the set-up operation, a substrate process is repeated. In fact, it is very difficult to achieve the customer specifications through one iteration of a substrate process due to changes in the customer specifications, and the like. In this case, the substrate process is performed using the dummy substrate instead of using the product substrate when performing the set-up operation. In addition, except that the substrate process is performed using the dummy substrate instead of the product substrate when performing the set-up operation, a substrate conveying method, the process conditions, and the like are the same as when processing the substrate, and thus description thereof will be omitted.

By utilizing several monitor substrates as well as the dummy substrate when performing an actual set-up operation and performing predetermined measurement on the monitor substrate using various measurement instruments, it is determined whether the quality of the substrate processing result reaches the customer specifications. When the substrate processing result does not satisfy the customer specifications, the substrate process is performed again, and repeatedly performed until the substrate processing result can satisfy the customer specifications. In addition, the dummy substrate may be used in a state of being loaded in the substrate holder, and only the monitor substrate may be conveyed.

In addition, management in which an accumulated film thickness of the dummy substrate is monitored until the accumulated film thickness becomes a threshold value and the dummy substrate with a relatively small accumulated film thickness is first used may be conceivable, but the number of dummy substrates required for the set-up operation is too large, which obviously causes a waste of the dummy substrate.

Since 100 or more substrate placing units are present in the substrate holder, the substrate process is performed in a state in which the dummy substrate is placed on most substrate placing units of the substrate holder. In general, management such as managing the accumulated film thickness using the threshold value and replacing the dummy substrate when the accumulated film thickness reaches the threshold value may be considered. In this case, the dummy substrate with the accumulated film thickness of 0 is newly placed at a position to replace an old dummy substrate. However, when the dummy substrate that reaches the threshold value and a new dummy substrate are mixed, it has been found that a difference in the accumulated film thickness cannot be ignored through a recent low-temperature process. Thus, it is difficult to adjust the quality of the substrate processing result in units of substrates, and the dummy substrate is wasted, resulting in an increase in costs. Accordingly, when the accumulated film thickness of any one dummy substrate exceeds the threshold value, all dummy substrates are replaced. However, management for effects on the accumulated film thickness deposited on the inside of the furnace is needed. In the related art, cleaning (removal of the accumulated film) is performed when the accumulated film thickness reaches the threshold value. However, this is not sufficient for the recent low-temperature process.

Thus, the threshold value of the accumulated film thickness is set in order to suppress particles due to the accumulated film thickness, but effects of the recent low-temperature process are not considered. Accordingly, it is necessary to optimize setting of the process parameter in accordance with the accumulated film thickness in addition to the number of substrates.

In the present embodiment (third embodiment), the substrate process according to the number of substrates and the accumulated film thickness may be performed using the setting method of the process parameter according to the above-described first and second embodiments. Specifically, a table in which a time (for example, "CP_Time-001" or "VP_Time-001") is defined for each accumulated film thickness or a table in which a temperature (for example, "CP_Temp-001" or "VP_Temp-001") is defined for each accumulated film thickness may be provided, and the substrate process according to the number of substrates and the accumulated film thickness may be easily performed using these tables in a process for automatically generating the CP (or VP) file in FIG. 9 (or FIG. 7).

In a substrate processing apparatus which includes a processing chamber configured to receive a substrate holder loaded with a plurality of substrates and process the plurality of substrates in the substrate holder; a recipe storage unit configured to store a first recipe including a process parameter for processing a substrate; a process parameter file storage unit configured to store a process parameter file including a plurality of first condition tables for associating the process parameter with a parameter name according to the number of substrates in the substrate holder to store the associated information and a plurality of second condition tables for associating the process parameter with the parameter name according to the accumulated film thickness deposited on component members of the substrate holder or the inner wall of the processing furnace to store the associated information; a control unit configured to execute a recipe for processing the substrate; an operation unit configured to receive an instruction from at least an operator; and a display unit configured to display various information, a recipe generation of the substrate processing apparatus according to the embodiments may be realized by performing following steps.

The recipe generation includes performing: a recipe display operation for displaying the process parameter of the first recipe on the display unit; a parameter name display operation for displaying the parameter name of the process parameter file on the display unit; a recipe parameter substitution operation for substituting the displayed process parameter with the displayed parameter name of the first recipe based on the operator's instruction received through the operation unit; and an operation for generating a second recipe by performing the parameter name display operation and the recipe parameter substitution operation at least once while displaying the recipe.

In addition, the recipe generation further includes a download operation for downloading, when the number of substrates in the substrate holder and the accumulated film thickness of the substrate holder or the inner wall of the processing chamber are selected, the second recipe, the first condition table corresponding to the selected number of substrates, and a second condition table corresponding to the selected accumulated film thickness to the control unit; and an operation for generating a third recipe by substituting the parameter name of the downloaded second recipe with the process parameter of the downloaded first and second condition tables may be further performed. Thus, by including the second condition table according to the accumulated film thickness, it is possible to generate the recipe in consideration of the accumulated film thickness as well as the number of substrates.

In addition, in the present embodiments, the first condition table according to the number of substrates and the second condition table according to the accumulated film thickness are used, but the recipe generation may be performed by performing a download operation for downloading the second recipe and a specific condition table to the control unit when the process parameter based on the number of substrates and the accumulated film thickness is designated in the specific condition table and the number of substrates in the substrate holder is selected; and an operation for generating a third recipe by substituting the parameter name of the downloaded second recipe with the process parameter of the downloaded condition table.

The present invention may be applied to a device for processing a glass substrate such as an LCD manufacturing apparatus or other substrate processing apparatus as well as the semiconductor manufacturing device. The substrate process may include annealing treatment, oxidation treatment, diffusion treatment, etching treatment, exposure treatment, lithography treatment, coating treatment, molding treatment, developing treatment, dicing treatment, wire bonding treatment, verification treatment, and the like as well as film-forming treatment for forming CVD, PVD, ALD, an epitaxial growth film, an oxidation film, a nitride film, a metal-containing film. In addition, types other than the vertical type, for example, single or multi-substrate processing apparatuses may be used. In particular, the present invention is preferably applied to the multi-substrate processing apparatus including the substrate placing unit (susceptor) in which a plurality of substrates are placed.

By the above-described configuration, it is possible to automatically set a process parameter suitable for a process condition of a process recipe before executing the process recipe.

In addition to the foregoing embodiment, the following preferred embodiment of the present invention will be additionally described.

(Supplementary Note 1)

According to an embodiment of the present invention, there is provided a substrate processing apparatus including:

a processing chamber configured to accommodate a substrate holder loaded with a plurality of substrates, and process the plurality of substrates in the substrate holder;

a recipe storage unit configured to store a first recipe including a process parameter for processing the substrate;

a process parameter file storage unit configured to associate the process parameter for processing the substrate and a parameter name that is an item name of the process parameter with the number of the substrates in the substrate holder to store as a condition table, and store a process parameter file including a plurality of condition tables according to the number of substrates;

a control unit configured to execute a recipe for processing the substrate;

an operation unit configured to receive an instruction from an operator; and a display unit configured to display various information, wherein the control unit performs a recipe display operation for displaying the process parameter of the first recipe stored in the recipe storage unit on the display unit, a parameter name display operation for displaying the parameter name of the process parameter file stored in the process parameter file storage unit on the display unit, a recipe parameter substitution operation for substituting the displayed process parameter with the displayed parameter name of the first recipe based on the operator's instruction from the operation unit, generating a second recipe by performing the displaying of the parameter name and the substituting of the recipe parameter at least once while displaying the recipe, a download operation for downloading, when the number of substrates in the substrate holder is selected, the second recipe and the condition table corresponding to the selected number of substrates to the control unit, and an operation for generating a third recipe by substituting the parameter name of the downloaded second recipe with the process parameter of the downloaded condition table.

(Supplementary Note 2)

According to another embodiment of the present invention, there is provided a method of manufacturing a semiconductor device which uses a substrate processing apparatus including a processing chamber configured to accommodate a substrate holder loaded with a plurality of substrates and process the plurality of substrates in the substrate holder, a recipe storage unit configured to store a first recipe including a process parameter for processing the substrate, a process parameter file storage unit configured to associate the process parameter for processing the substrate and a parameter name that is an item name of the process parameter with the number of the substrates in the substrate holder to store as a condition table and store a process parameter file including a plurality of condition tables according to the number of substrates, a control unit configured to execute a recipe for processing the substrate, an operation unit configured to receive an instruction from an operator, and a display unit configured to display various information, the method including:

displaying the process parameter of the first recipe stored in the recipe storage unit on the display unit;

displaying the parameter name of the process parameter file stored in the process parameter file storage unit on the display unit;

substituting the process parameter of the displayed first recipe with the displayed parameter name based on the operator's instruction from the operation unit;

displaying the parameter name while displaying the recipe, and generating a second recipe by performing the substituting at least once;

downloading, when the number of substrates in the substrate holder is selected, the second recipe and the condition table corresponding to the selected number of substrates to the control unit; and generating a third recipe by substituting the parameter name of the downloaded second recipe with the process parameter of the downloaded condition table, and accommodating the substrate holder loaded with the selected number of substrates and executing the third recipe.

(Supplementary Note 3)

According to still another embodiment of the present invention, there is provided a method of generating a recipe used in a substrate processing apparatus including a processing chamber configured to accommodate a substrate holder loaded with a plurality of substrates and process the plurality of substrates in the substrate holder, a recipe storage unit configured to store a first recipe including a process parameter for processing the substrate, a process parameter file storage unit configured to associate the process parameter for processing the substrate and a parameter name that is an item name of the process parameter with the number of the substrates in the substrate holder to store as a condition table and store a process parameter file including a plurality of condition tables according to the number of substrates, a control unit configured to execute a recipe for processing the substrate, an operation unit configured to receive an instruction from an operator, and a display unit configured to display various information, the method including:

displaying the process parameter of the first recipe stored in the recipe storage unit on the display unit;

displaying the parameter name of the process parameter file stored in the process parameter file storage unit on the display unit;

substituting the process parameter of the displayed first recipe with the displayed parameter name based on the operator's instruction from the operation unit;

generating a second recipe by performing the displaying of the parameter name and the substituting of the recipe parameter at least once while displaying the recipe;

downloading, when the number of substrates in the substrate holder is selected, the second recipe and the condition table corresponding to the selected number of substrates to the control unit; and generating a third recipe by substituting the parameter name of the downloaded second recipe with the process parameter of the downloaded condition table.

(Supplementary Note 4)

According to yet another embodiment of the present invention, there is provided a non-transitory computer-readable recording medium storing a program for generating a recipe used in a substrate processing apparatus including a processing chamber configured to accommodate a substrate holder loaded with a plurality of substrates and process the plurality of substrates in the substrate holder, a recipe storage unit configured to store a first recipe including a process parameter for processing the substrate, a process parameter file storage unit configured to associate the process parameter for processing the substrate and a parameter name that is an item name of the process parameter with the number of the substrates in the substrate holder to store as a condition table and store a process parameter file including a plurality of condition tables according to the number of substrates, an operation unit configured to receive an instruction from an operator, and a display unit configured to display various information, the program including:

a recipe display operation for displaying the process parameter of the first recipe stored in the recipe storage unit on the display unit;

a parameter name display operation for displaying the parameter name of the process parameter file stored in the process parameter file storage unit on the display unit;

a recipe parameter substitution operation for substituting the displayed process parameter with the displayed parameter name of the first recipe based on the operator's instruction from the operation unit; and an operation for generating a second recipe by performing the parameter name display operation and the recipe parameter substitution operation while displaying the recipe.

(Supplementary Note 5)

Preferably, the non-transitory computer-readable recording medium storing the program for generating the recipe of Supplementary Note 4, further includes:

an operation for generating, when the number of substrates in the substrate holder is selected, a third recipe by substituting the parameter name of the second recipe with the process parameter of the condition table corresponding to the selected number of substrates.

(Supplementary Note 6)

According to yet another embodiment of the present invention, there is provided a substrate processing apparatus including:

a processing chamber configured to process a substrate;

a recipe storage unit configured to store a first recipe including a process parameter for processing the substrate;

a process parameter file storage unit configured to store the process parameter for processing the substrate and a process parameter file including a plurality of combinations with a parameter name that is an item name of the process parameter;

a control unit configured to execute a recipe for processing the substrate;

an operation unit configured to receive an instruction from an operator; and a display unit configured to display various information, wherein the control unit performs a recipe display operation for displaying the process parameter of the first recipe stored in the recipe storage unit on the display unit, a parameter name display operation for displaying the parameter name of the process parameter file stored in the process parameter file storage unit on the display unit, a recipe parameter substitution operation for substituting the displayed process parameter with the displayed parameter name of the first recipe based on the operator's instruction from the operation unit, an operation for generating a second recipe by performing the parameter name display operation, and the recipe parameter substitution operation while displaying the recipe, a download operation for downloading the process parameter file stored in the process parameter file storage unit to the control unit, as the second recipe; and an operation for generating a third recipe by substituting the process parameter of the downloaded process parameter file for the parameter name of the downloaded second recipe.

(Supplementary Note 7)

According to another embodiment of the present invention, there is provided a method of manufacturing a semiconductor device which uses a substrate processing apparatus including a processing chamber configured to process a substrate, a recipe storage unit configured to store a first recipe including a process parameter for processing the substrate, a process parameter file storage unit configured to store the process parameter for processing the substrate and a process parameter file including a plurality of combinations with a parameter name that is an item name of the process parameter, a control unit configured to execute a recipe for processing the substrate, an operation unit configured to receive an instruction from an operator, and a display unit configured to display various information, the method including:

displaying the process parameter of the first recipe stored in the recipe storage unit on the display unit;

displaying the parameter name of the process parameter file stored in the process parameter file storage unit on the display unit;

substituting the displayed process parameter with the displayed parameter name of the first recipe based on the operator's instruction from the operation unit;

generating a second recipe by performing the displaying of the parameter name, and the substituting of the recipe parameter while displaying the recipe;

downloading the process parameter file stored in the process parameter file storage unit, to the control unit as the second recipe; and generating a third recipe by substituting the process parameter of the downloaded process parameter file for the parameter name of the downloaded second recipe; and accommodating, in the processing chamber, a substrate holder in which the plurality of substrates are mounted, and executing the third recipe.

(Supplementary Note 8)

According to another embodiment of the present invention, there is provided a method of generating a recipe used in a substrate processing apparatus including a processing chamber configured to process a substrate, a recipe storage unit configured to store a first recipe including a process parameter for processing the substrate, a process parameter file storage unit configured to store the process parameter for processing the substrate and a process parameter file including a plurality of combinations with a parameter name that is an item name of the process parameter, a control unit configured to execute a recipe for processing the substrate, an operation unit configured to receive an instruction from an operator, and a display unit configured to display various information, the method including:

displaying the process parameter of the first recipe stored in the recipe storage unit on the display unit, displaying the parameter name of the process parameter file stored in the process parameter file storage unit on the display unit, substituting the displayed process parameter with the displayed parameter name of the first recipe based on the operator's instruction from the operation unit, generating a second recipe by performing the displaying of the parameter name and the substituting of the recipe parameter while displaying the recipe, downloading, to the control unit, the process parameter file stored in the process parameter file storage unit as the second recipe; and generating a third recipe by substituting the process parameter of the downloaded process parameter file for the parameter name of the downloaded second recipe.

(Supplementary Note 9)

According to another embodiment of the present invention, there is provided a substrate processing apparatus including:

a processing chamber configured to accommodate a substrate holder loaded with a plurality of substrates and process the plurality of substrates in the substrate holder;

a recipe storage unit configured to store a first recipe including a process parameter for processing the substrate;

a process parameter file storage unit configured to associate the process parameter for processing the substrate and a parameter name that is an item name of the process parameter with the number of the substrates in the substrate holder to store as a condition table and store a process parameter file including a plurality of condition tables according to the number of substrates; and a control unit configured to execute a recipe for processing the substrate, wherein the control unit performs a generation operation of generating a second recipe by substituting the parameter name of the process parameter file stored in the process parameter file storage unit for the process parameter of the first recipe and setting the recipe in which the parameter name has been substituted as the second recipe;

a download operation for downloading, when the number of substrates in the substrate holder is selected, the second recipe and the condition table corresponding to the selected number of substrates to the control unit; and an operation for generating a third recipe by substituting the process parameter of the downloaded condition table for the parameter name of the downloaded second recipe.

(Supplementary Note 10)

According to another embodiment of the present invention, there is provided a method of manufacturing a semiconductor device, including:

storing a first recipe;

associating a process parameter for processing a substrate and a parameter name that is an item name of the process parameter with the number of substrates in a substrate holder to store as a condition table, and storing a process parameter file including a plurality of condition tables according to the number of substrates;

displaying a process parameter of the stored first recipe;

displaying a parameter name of the stored process parameter file;

substituting the displayed parameter name for the process parameter of the displayed first recipe, and generating a second recipe by performing the displaying of the process parameter and the substituting of the recipe parameter while displaying the recipe;

generating a third recipe by substituting the process parameter of the condition table for the parameter name of the second recipe when the number of substrates to be processed is selected; and executing the third recipe with respect to the selected number of substrates.

(Supplementary Note 11)

According to another embodiment of the present invention, there is provided a method of generating a recipe, including:

storing a first recipe;

associating a process parameter for processing a substrate and a parameter name that is an item name of the process parameter with the number of substrates in a substrate holder to store as a condition table, and storing a process parameter file including a plurality of condition tables according to the number of substrates;

displaying a process parameter of the stored first recipe;

displaying a parameter name of the stored process parameter file;

substituting the displayed parameter name for the process parameter of the displayed first recipe, and generating a second recipe by performing the displaying of the process parameter and the substituting of the recipe parameter while displaying the recipe; and generating a third recipe by substituting the process parameter of the condition table for the parameter name of the second recipe when the number of substrates to be processed is selected.

(Supplementary Note 12)

According to another embodiment of the present invention, there is provided a non-transitory computer-readable recording medium storing a program for generating a recipe, including:

storing a first recipe;

associating a process parameter for processing a substrate and a parameter name that is an item name of the process parameter with the number of substrates in a substrate holder to store as a condition table, and storing a process parameter file including a plurality of condition tables according to the number of substrates;

displaying a process parameter of the stored first recipe;

displaying a parameter name of the stored process parameter file;

substituting the displayed parameter name for the process parameter of the displayed first recipe; and generating a second recipe by performing the displaying of the process parameter and the substituting of the recipe parameter while displaying the recipe.

(Supplementary Note 13)

Preferably, the non-transitory computer-readable recording medium storing the program for generating the recipe of Supplementary Note 12 further includes:

generating a third recipe by substituting the process parameter of the condition table for the parameter name of the second recipe when the number of substrates to be processed is selected.

(Supplementary Note 14)

According to another embodiment of the present invention, there is provided a substrate processing apparatus including:

a processing chamber configured to accommodate a substrate holder loaded with a plurality of substrates and process the plurality of substrates in the substrate holder;

a recipe storage unit configured to store a first recipe including a process parameter for processing the substrate;

a process parameter file storage unit configured to associate the process parameter for processing the substrate and a parameter name that is an item name of the process parameter with the number of the substrates in the substrate holder to store as a condition table and store a process parameter file including a plurality of condition tables according to the number of substrates; and a control unit configured to execute a recipe for processing the substrate, wherein the control unit performs operations for substituting the parameter name of the process parameter file stored in the process parameter file storage unit for the process parameter of the first recipe and setting the recipe in which the parameter name has been substituted as a second recipe; and an operation for generating, when the number of substrates in the substrate holder is selected, a third recipe by substituting the process parameter of the condition table corresponding to the selected number of substrates for the parameter name of the second recipe.

(Supplementary Note 15)

According to another embodiment of the present invention, there is provided a method of generating a recipe, including:

displaying a process parameter of a first recipe;

displaying a parameter name of a process parameter file;

substituting the displayed parameter name for the process parameter of the first recipe; and generating a second recipe by performing the displaying of the parameter name and the substituting of the recipe parameter while displaying the first recipe.

(Supplementary Note 16)

Preferably, the method of generating the recipe of Supplementary Note 15 further includes:

downloading, when a predetermined processing condition is selected at the time of starting the recipe, the second recipe and the process parameter file; and generating a third recipe by substituting the process parameter of the downloaded process parameter file for the parameter name of the downloaded second recipe.

(Supplementary Note 17)

According to another embodiment of the present invention, there is provided a non-transitory computer-readable recording medium storing a program for generating a recipe, including:

displaying a process parameter of a first recipe;

displaying a parameter name of a process parameter file;

substituting the displayed parameter name for the process parameter of the first recipe; and generating a second recipe by performing the displaying of the parameter name and the substituting of the recipe parameter while displaying the first recipe.

(Supplementary Note 18)

Preferably, the non-transitory computer-readable recording medium storing the program of generating the recipe of Supplementary Note 17 further includes;

downloading the second recipe and the process parameter file; and generating a third recipe by substituting the process parameter of the downloaded process parameter file for the parameter name of the downloaded second recipe.

(Supplementary Note 19)

According to another embodiment of the present invention, there is provided a substrate processing apparatus including:

a processing chamber configured to accommodate a substrate holder loaded with a plurality of substrates and process the plurality of substrates in the substrate holder;

a recipe storage unit configured to store a first recipe including a process parameter for processing the substrate;

a process parameter file storage unit configured to associate the process parameter for processing the substrate and a parameter name that is an item name of the process parameter with the number of the substrates in the substrate holder to store as a first condition table, associate the process parameter with the parameter name according to a value of an accumulated film thickness deposited on the substrate to store as a second condition table, and store a process parameter file including a plurality of first condition tables according to the number of substrates and a plurality of second condition tables according to the value of the accumulated film thickness;

a control unit configured to execute a recipe for processing the substrate;

an operation unit configured to receive an instruction from an operator; and a display unit configured to display various information, wherein the control unit performs a recipe display operation for displaying the process parameter of the first recipe stored in the recipe storage unit on the display unit, a parameter name display operation for displaying the parameter name of the process parameter file stored in the process parameter file storage unit on the display unit, a substitution operation for substituting the displayed parameter name for the process parameter of the displayed first recipe based on the operator's instruction from the operation unit;

an operation for generating a second recipe by performing the displaying of the parameter name and the substituting of the recipe parameter at least once while displaying the recipe;

an operation for downloading, when the number of substrates in the substrate holder and a value of an accumulated film thickness deposited on the substrate holder and an inner wall of the processing chamber are selected, the second recipe, the first condition table corresponding to the selected number of substrates, and the second condition table corresponding to the value of the accumulated film thickness deposited on the substrate holder and the inner wall of the processing chamber, to the control unit; and an operation for generating a third recipe by substituting the process parameter of the downloaded first and second condition tables for the parameter name of the downloaded second recipe.

(Supplementary Note 20)

According to another embodiment of the present invention, there is provided a method of manufacturing a semiconductor device which uses a substrate processing apparatus including a processing chamber configured to accommodate a substrate holder loaded with a plurality of substrates and process the plurality of substrates in the substrate holder, a recipe storage unit configured to store a first recipe including a process parameter for processing the substrate, a process parameter file storage unit configured to associate the process parameter for processing the substrate and a parameter name that is an item name of the process parameter with the number of the substrates in the substrate holder to store as a first condition table, associate the process parameter with the parameter name according to a value of an accumulated film thickness deposited on the substrate to store as a second condition table, and store a process parameter file including a plurality of first condition tables according to the number of substrates and a plurality of second condition tables according to the value of the accumulated film thickness, a control unit configured to execute a recipe for processing the substrate, an operation unit configured to receive an instruction from an operator, and a display unit configured to display various information, wherein the control unit performs a recipe display operation for displaying the process parameter of the first recipe stored in the recipe storage unit on the display unit, a parameter name display operation for displaying the parameter name of the process parameter file stored in the process parameter file storage unit on the display unit, a substitution operation for substituting the displayed parameter name for the process parameter of the displayed first recipe based on the operator's instruction from the operation unit;

an operation for generating a second recipe by performing the displaying of the parameter name and the substituting of the recipe parameter at least once while displaying the recipe;

an operation for downloading, when the number of substrates in the substrate holder and a value of an accumulated film thickness deposited on the substrate holder and an inner wall of the processing chamber are selected, the second recipe, the first condition table corresponding to the selected number of substrates, and the second condition table corresponding to the value of the accumulated film thickness deposited on the substrate holder and the inner wall of the processing chamber, to the control unit; and an operation for generating a third recipe by substituting the process parameter of the downloaded first and second condition tables for the parameter name of the downloaded second recipe.

(Supplementary Note 21)

According to another embodiment of the present invention, there is provided a method of generating a recipe, including:

displaying a process parameter of a first recipe;

displaying a parameter name of a process parameter file on the display unit;

substituting the displayed parameter name for the process parameter of the first recipe; and generating a second recipe by performing the displaying of the parameter name and the substituting of the recipe parameter at least once while displaying the recipe.

(Supplementary Note 22)

According to another embodiment of the present invention, there is provided a method of generating a recipe, including:

downloading, when predetermined processing conditions, for example, the number of substrates in a substrate holder and a value of an accumulated film thickness deposited on the substrate holder and an inner wall of a processing chamber are selected, a second recipe, a first condition table and a second condition table corresponding to the selected number of substrates; and generating a third recipe by substituting a process parameter of the downloaded first and second condition tables for a parameter name of the downloaded second recipe.

What is claimed is:

1. A control method performed by a substrate processing apparatus comprising:
    a processing chamber configured to process a substrate;
    a hard disk comprising:
        a recipe storage storing a process recipe including an item field and a value field for processing the substrate, wherein the value field includes a numeric value which represents a time required for a step of the process recipe; and
        a process parameter file storage storing a process parameter file including a process parameter name and a plurality of condition tables, wherein each condition table includes a process parameter corresponding to a number of substrates to be processed in the processing chamber;
    a controller configured to execute the process recipe; and
    a display configured to display at least the process parameter and the process parameter name, the control method comprising:
    (a) displaying the item field and the value field of the process recipe stored in the process recipe storage unit on the display;
    (b) associating the process recipe with the process parameter file;
    (c) displaying the parameter name of the process parameter file associated with the process recipe on the display;
    (d) substituting the numeric value in the value field of the process recipe with the process parameter name of the process parameter file associated with the process recipe;
    (e) acquiring the number of substrates to be processed;
    (f) extracting one of the plurality of condition tables corresponding to the acquired number of substrates to be processed;
    (g) creating a new process recipe by substituting the parameter name in the value field with the process parameter in the extracted one of the plurality of condition tables; and
    (h) controlling a parameter of the processing chamber based on the process parameter in the new process recipe when processing the substrate.

2. The method according to claim 1, wherein one of a variable parameter and a condition parameter is selected after an item of the process parameter is selected.

3. The method according to claim 1, wherein the plurality of condition tables comprise number of product substrates or number of substrates including dummy substrates and the product substrates.

* * * * *